United States Patent
Pasqualini (12) 
(10) Patent No.: US 6,184,729 B1
(45) Date of Patent: Feb. 6, 2001

(54) LOW GROUND BOUNCE AND LOW POWER SUPPLY BOUNCE OUTPUT DRIVER

(75) Inventor: Ronald Pasqualini, Los Altos, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/168,547

(22) Filed: Oct. 8, 1998

(51) Int. Cl.[7] .................................................. H03B 1/00
(52) U.S. Cl. ......................... 327/112; 327/384; 327/396; 326/27; 326/85
(58) Field of Search ........................... 327/108–112, 170, 327/379, 382, 384, 385, 392, 393–395, 396, 401, 261, 269; 326/82, 83, 85, 26, 27; 361/91, 91.3, 111

(56) References Cited

U.S. PATENT DOCUMENTS

| | | | | |
|---|---|---|---|---|
| 5,319,252 | * | 6/1994 | Pierce et al. | 327/170 |
| 5,497,105 | * | 3/1996 | Oh et al. | 326/27 |
| 5,838,177 | * | 11/1998 | Keeth | 327/108 |

* cited by examiner

*Primary Examiner*—Timothy P. Callahan
*Assistant Examiner*—Minh Nguyen
(74) *Attorney, Agent, or Firm*—Limbach & Limbach L.L.P.

(57) ABSTRACT

Ground bounce and power supply bounce are reduced in an output driver by utilizing a plurality of p-channel and n-channel transistors which are connected to an output pad, by sequentially turning off the p-channel transistors before sequentially turning on the n-channel transistors, and by sequentially turning off the n-channel transistors before sequentially turning on the p-channel transistors.

15 Claims, 7 Drawing Sheets

LOW GROUND BOUNCE AND LOW POWER SUPPLY BOUNCE OUTPUT DRIVER

BACKGROUND OF THE INVENTION

1. Field of the Invention

The present invention relates to output drivers and, more particularly, to a low ground bounce and low power supply bounce output driver.

2. Description of the Related Art

A CMOS digital output driver is a well known circuit that outputs a logic high or a logic low to a load capacitance by charging or discharging the load capacitance. In practice, several output drivers are often connected to the same ground (GND) line and the same power supply (VCC) line.

One of the problems associated with connecting several noisy (high di/dt) output drivers to the same ground line is that significant ground bounce (switching noise) can be generated when many (or all) of these output drivers discharge their load capacitances at the same time.

Figure 1:
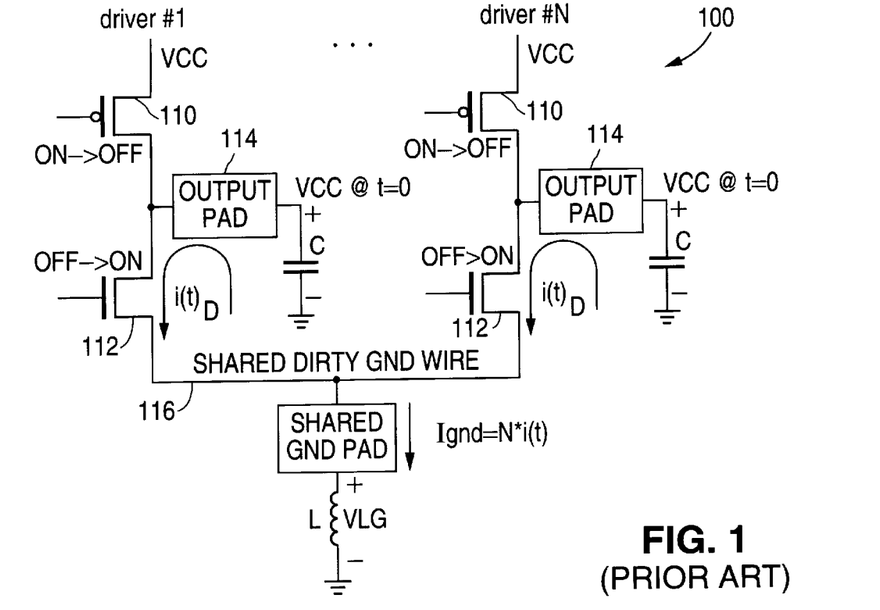
FIG. 1 is a circuit diagram illustrating a portion of a conventional output driver circuit 100.

FIG. 1 shows a circuit diagram that illustrates a portion of a conventional output driver circuit 100. As shown in FIG. 1, driver circuit 100 includes a series of high di/dt output drivers driver#1–driver#N which each have a p-channel transistor 110 and an n-channel transistor 112.

Each p-channel transistor 110 has a source connected to a power supply VCC, a drain connected to an output pad 114, and a gate. Each n-channel transistor 112 has a source connected to a common ground line 116, a drain connected to the drain of the p-channel transistor 110, and a gate.

During normal operation, when a single output driver is switched from a logic high to a logic low, a time varying current $i(t)_D$ from the load capacitance is placed on common ground line 116 as a result of the load capacitance being discharged. Similarly, when all of the output drivers driver#1–driver#N are simultaneously switched from a logic high to a logic low, a large time varying discharge current, which is the sum of the individual time varying discharge currents $i(t)_D$, is placed on common ground line 116.

The large time varying discharge current causes the voltage on common ground line 116 to vary due to the inductance of common ground line 116 (which is shown as an inductor L). As shown in EQ. 1, the voltage variation VLG on common ground line 116 is defined as follows:

$$VLG = L*N(di(t)/dt) \quad \text{EQ. 1}$$

where L represents the inductance of common ground line 116 (including package inductance and bondwire inductance), N represents the number of drivers driver#1–driver#N that are discharging their load capacitances at the same time, and di(t)/dt represents the time varying discharge current $i(t)_D$ through a single driver.

Thus, as shown in EQ. 1, extremely high ground bounce (switching noise) can be generated when several drivers driver#1–driver#N are switched from a logic high to a logic low at the same time.

Similarly, a significant power supply bounce (switching noise) can be generated when several noisy (high di/dt) output drivers charge their load capacitances from the same power supply line at the same time.

Figure 2:
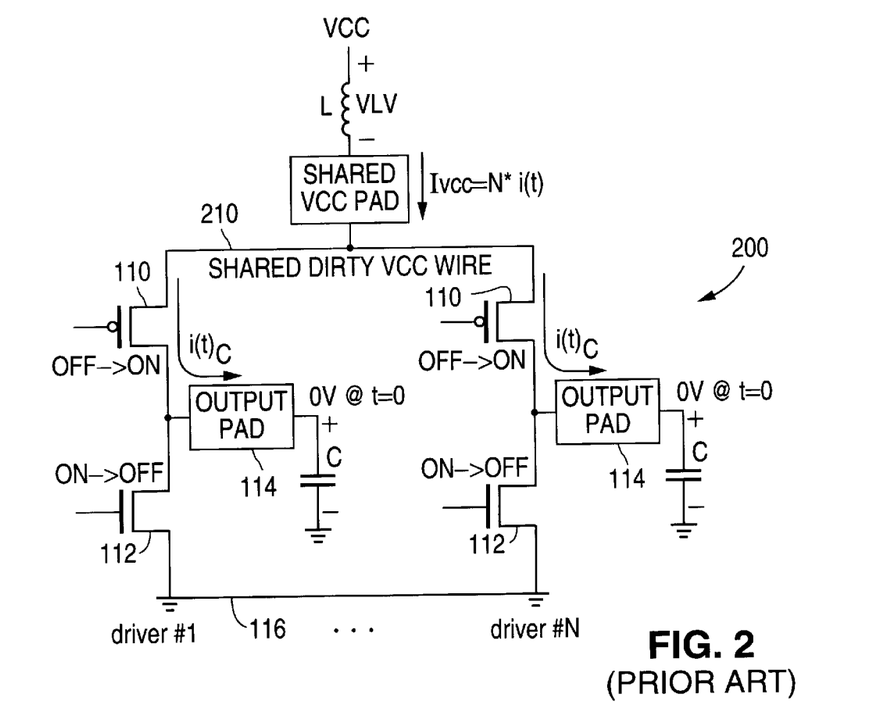
FIG. 2 is a circuit diagram illustrating a portion of a conventional output driver circuit 200.

FIG. 2 shows a circuit diagram that illustrates a portion of a conventional output driver circuit 200. Output driver circuit 200 is similar to output driver circuit 100 and, as a result, utilizes the same reference numerals to designate the structures which are common to both circuits.

In addition to the elements of circuit 100, output driver circuit 200 also includes a common power supply line 210 which is connected to the source of the p-channel transistor 110 in each of the output drivers driver#1–driver#N.

During normal operation, when a single output driver is switched from a logic low to a logic high, a time varying charge current $i(t)_c$ from the VCC power supply is placed on common power supply line 210, as a result of the load capacitance being charged. Similarly, when all of the output drivers driver#1–driver#N are simultaneously switched from a logic low to a logic high, a large time varying charge current from the VCC power supply is placed on common power supply line 210. This time varying current is the sum of the individual time varying charge currents $i(t)_c$.

The large time varying current causes the voltage on common power supply line 210 to also vary due to the inductance of line 210 (shown as inductor L). As shown in EQ. 2, the voltage variation VLV on common power supply line 210 is defined as follows:

$$VLV = L*N(di(t)/dt) \quad \text{EQ. 2}$$

where L represents the inductance of power supply line 210 (including package inductance and bondwire inductance), N represents the number of drivers driver#1–driver#N that are charging their load capacitances at the same time, and di(t)/dt represents a single time varying charge current $i(t)_c$.

Thus, as shown in EQ. 2, extremely high power supply bounce (switching noise) can be generated when several drivers driver#1–driver#N are switched from a logic low to a logic high at the same time.

Thus, in view of the above discussion, there is a need for an output driver that can minimize the ground bounce and power supply bounce that can occur when several high di/dt output drivers discharge or charge their load capacitances at the same time.

SUMMARY OF THE INVENTION

Conventionally, noisy (high di/dt) output drivers can generate significant ground bounce and power supply bounce whenever they switch from high to low or from low to high at the same time.

Ground bounce and power supply bounce are reduced in the present invention by utilizing an output driver that charges and discharges its associated load capacitance in a controlled, step-wise fashion. The present invention is especially useful for implementing fast, high current output drivers which must drive high capacitive loads, such as PCI bus drivers. In addition, mixed signal (analog/digital) chips will greatly benefit from the reduced switching noise (bounce) that occurs on the VCC and ground lines.

An output driver in accordance with the present invention includes first and second delay circuits. The first delay circuit has an input connected to receive a first input signal, while the second delay circuit has an input connected to receive a second input signal.

The first delay circuit drives a plurality of identical first delay circuits which are serially connected (daisy chained). These identical, serially-connected delay circuits output a corresponding plurality of delayed first signals which change logic states at different times after the first input signal changes logic state.

Similarly, the second delay circuit drives a plurality of identical second delay circuits which are serially connected (daisy chained). These identical, serially-connected delay circuits output a corresponding plurality of delayed second signals which change logic states at different times after the second input signal changes logic state.

In addition to the first and second delay circuits, the output driver of the present invention also includes a plurality of p-channel driver transistors and a plurality of n-channel driver transistors. Each p-channel driver transistor is connected to receive a delayed signal from the chain of first delay circuits, while each n-channel driver transistor is connected to receive a delayed signal from the chain of second delay circuits. The drain terminals of all p-channel driver transistors are connected together at the output node, and the drain terminals of all n-channel driver transistors are also connected together at the output node.

During normal operation, the first chain of delay circuits sequentially turns off the plurality of p-channel driver transistors before the second chain of delay circuits begins to sequentially turn on the plurality of n-channel driver transistors. Furthermore, the second chain of delay circuits sequentially turns off the plurality of n-channel driver transistors before the first chain of delay circuits begins to sequentially turn on the plurality of p-channel driver transistors. Thus, by sequentially controlling the turn-off and turn-on of the p-channel driver transistors and the n-channel driver transistors, ground bounce and power supply bounce are both substantially reduced.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 7C1 and 7C2 are waveform diagrams illustrating the real-world operation of circuit 600 in accordance with the present invention.

DESCRIPTION OF THE PRESENT INVENTION

Figure 3:
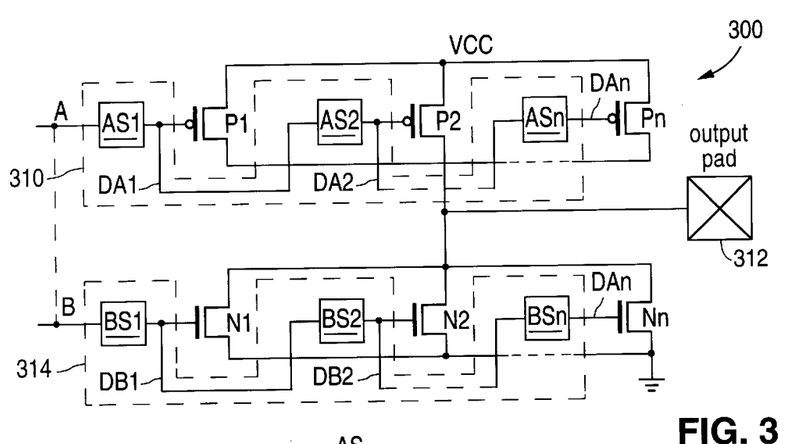
FIG. 3 is a circuit diagram illustrating a low ground bounce/low power supply bounce output driver 300 in accordance with the present invention.

FIG. 3 shows a circuit diagram that illustrates a low ground bounce/low power supply bounce output driver 300 in accordance with the present invention. As described in greater detail below, the present invention minimizes ground bounce and power supply bounce by utilizing several p-channel and n-channel driver transistors, and by asymmetrically delaying the turn-on and turn-off of these transistors.

As shown in FIG. 3, driver 300 includes a first delay circuit 310 that has an input which is connected to receive a first input signal A, and a series of serially-connected delay stages AS1–ASn. Delay stages AS1–ASn, in turn, output a corresponding series of delayed first signals DA1–DAn which change logic states at different times after the logic state of the first input signal A changes state.

As further shown in FIG. 3, driver 300 also includes a series of p-channel MOS driver transistors P1–Pn each of which has a source connected to a power supply VCC, a drain connected to an output pad 312, and a gate connected to receive one of the delayed first signals DA1–DAn.

In addition, driver 300 further includes a second delay circuit 314 that has an input which is connected to receive a second input signal B, and a series of serially-connected delay stages BS1–BSn. (The input of delay circuit 310 and the input of delay circuit 314 can be connected together, as shown by the dashed line in FIG. 3, when a switchable high impedance buffer, such as a TRI-STATE™ buffer, is not being implemented).

Delay stages BS1–BSn output a corresponding series of delayed second signals DB1–DBn which change logic states at different times after the logic state of the second input signal B changes state.

Furthermore, driver 300 additionally includes a series of n-channel MOS driver transistors N1–Nn which each of which has a source connected to a common ground, a drain connected to output pad 312, and a gate connected to receive one of the delayed second signals DB1–DBn.

Figure 4:
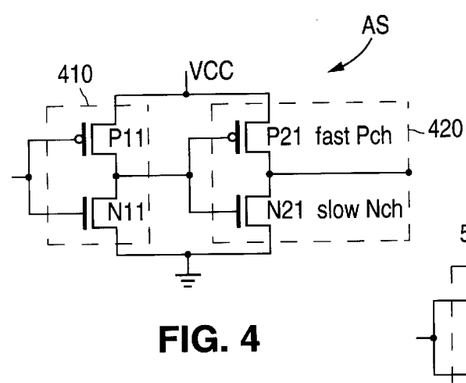
FIG. 4 is a circuit diagram illustrating a first delay circuit AS in accordance with the present invention.
Figure 5:
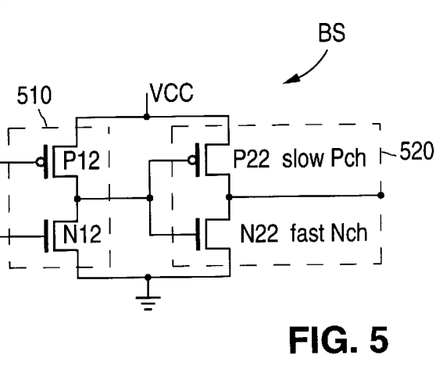
FIG. 5 is a circuit diagram illustrating a second delay circuit BS in accordance with the present invention.

FIG. 4 shows a circuit diagram that illustrates a delay stage AS in accordance with the present invention. FIG. 5 shows a circuit diagram that illustrates a delay stage BS in accordance with the present invention.

As shown in FIG. 4, stage AS, which is non-inverting, includes two inverters in series, a first inverter 410 and a second inverter 420. As further shown in FIG. 4, inverter 410 includes a p-channel transistor P11 and an n-channel transistor N11, while inverter 420 includes a p-channel transistor P21 and an n-channel transistor N21.

Although transistors P11 and N11 of inverter 410 have ordinary W/L ratios, the W/L ratios of transistors P21 and N21 of inverter 420 are highly skewed. Thus, p-channel transistor P21 is formed to provide a very fast charge time, and n-channel transistor N21 is formed to provide a relatively slow discharge time.

The aforementioned asymmetry ensures that the output rise time of inverter 420 will be much faster than the output fall time of inverter 420. Therefore, because inverter 420 directly drives transistors P1–Pn in FIG. 3, each p-channel transistor P1–Pn will turn off very fast, and will turn on relatively slowly.

Similarly, as shown in FIG. 5, each stage BS, which is non-inverting, includes two inverters in series, a first inverter 510 and a second inverter 520. As further shown in FIG. 5, inverter 510 includes a p-channel transistor P12 and an n-channel transistor N12, while inverter 520 includes a p-channel transistor P22 and an n-channel transistor N22.

Although transistors P12 and N12 of inverter 510 have ordinary W/L ratios (like transistors P11 and N11 of inverter 410), the W/L ratios of transistors P22 and N22 of inverter 520 are highly skewed. Thus, p-channel transistor P22 is formed to provide a relatively slow charge time, and n-channel transistor N22 is formed to provide a very fast discharge time.

The aforementioned asymmetry ensures that the output fall time of inverter 520 will be much faster than the output rise time of inverter 520. Therefore, because inverter 520 directly drives transistors N1–Nn in FIG. 3, each n-channel transistor N1–Nn will turn off very fast and will turn on relatively slowly.

During normal circuit operation, delay circuits 310 and 314 work together to ensure that current spikes cannot occur from VCC to ground due to one or more p-channel transistors P1–Pn being on while one or more n-channel transistors N1–Nn are also on at the same time.

Thus, if the n-channel transistors N1–Nn are initially on and the p-channel transistors P1–Pn are initially off, delay circuit 314 will turn off all of the n-channel transistors N1–Nn before delay circuit 310 turns on any of the p-channel transistors P1–Pn.

Conversely, if the p-channel transistors P1–Pn are initially on and the n-channel transistors N1–Nn are initially off, delay circuit 310 will turn off all of the p-channel transistors before delay circuit 314 turns on any of the n-channel transistors N1–Nn.

In addition to preventing VCC-to-ground current spikes, delay circuits 310 and 314 also provide another extremely critical circuit function: they turn on the p-channel transistors P1–Pn and the n-channel transistors N1–Nn relatively slowly. This slow turn-on is absolutely essential to achieving low ground/VCC bounce.

Figure 6:
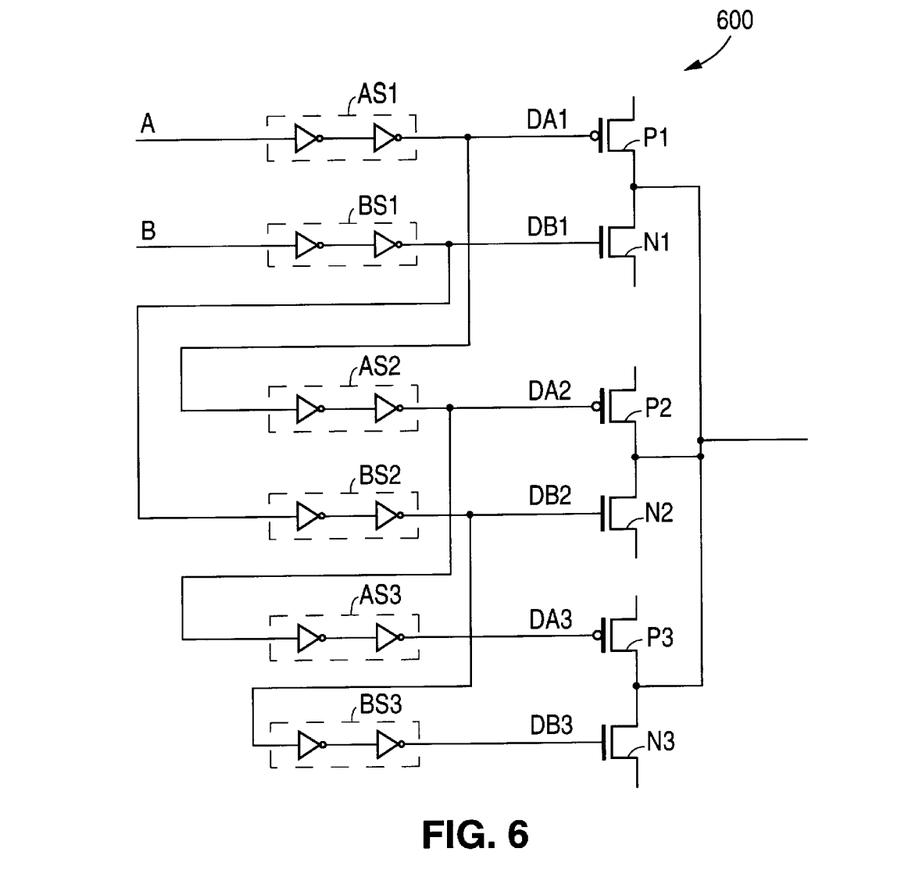
FIG. 6 is a circuit diagram illustrating an output driver circuit 600 in accordance with the present invention.

FIG. 6 shows a circuit diagram that illustrates an output driver circuit 600 in accordance with the present invention. Output driver circuit 600 is similar to output driver circuit 300 and, as a result, utilizes the same reference numerals to designate the structures which are common to both circuits.

Output driver circuit 600 primarily differs from output driver circuit 300 in that circuit 600 utilizes three delay stages AS1–AS3 to form delay circuit 310, three delay stages BS1–BS3 to form delay circuit 314, three p-channel driver transistors P1–P3, and three n-channel driver transistors N1–N3.

Figure 7A:
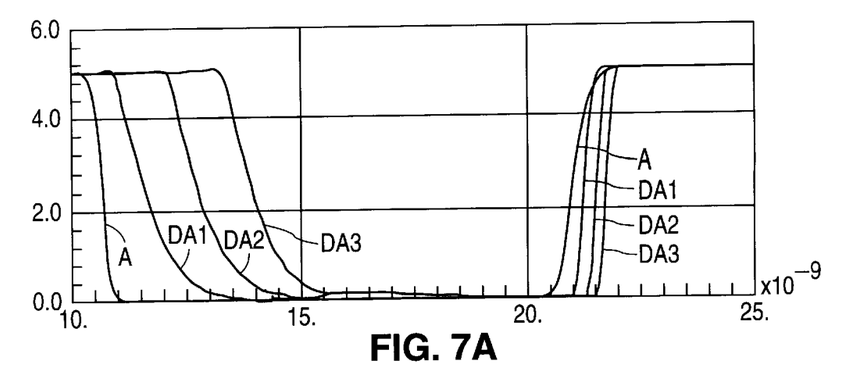
FIGS. 7A and 7B are waveform diagrams illustrating the real-world operation of circuit 600 in accordance with the present invention.
Figure 7B:
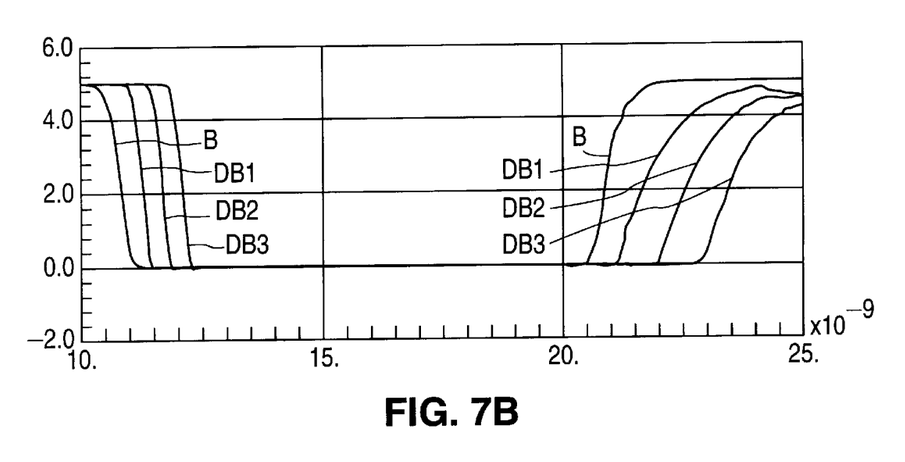

FIGS. 7A and 7B show waveform diagrams which illustrate a high speed application of circuit 600 in accordance with the present invention. As shown in FIGS. 7A and 7B, the DB3 waveform (taken from the output of delay stage BS3) falls and turns off the last n-channel driver transistor N3 before the DA1 waveform (taken from the output of delay stage AS1) has fallen to turn on the initial p-channel driver transistor P1. This behavior prevents current spikes from occurring when the output pad is being charged up to the logic one level.

Similarly, the DA3 waveform rises to turn off the last p-channel driver transistor P3 before the DB1 waveform rises to turn on the initial n-channel driver transistor N1. This behavior prevents current spikes from occurring when the output pad is being discharged to the logic zero level.

Figure 7C:
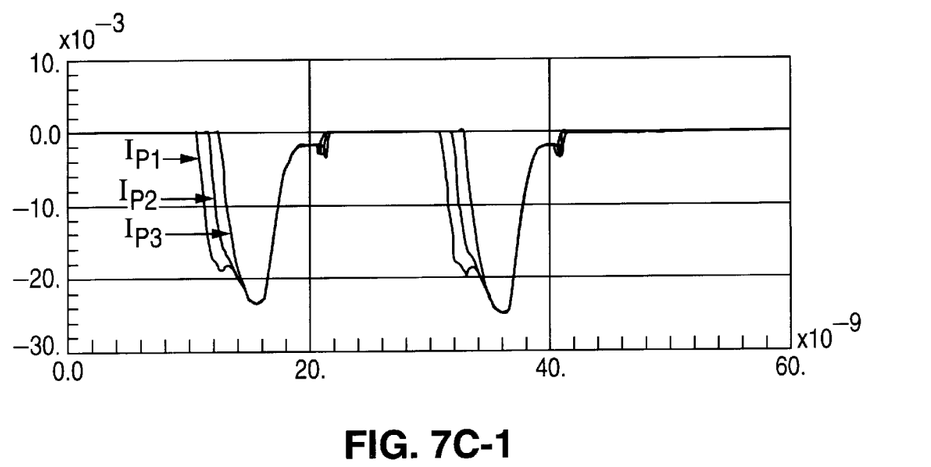
Figure 7C:
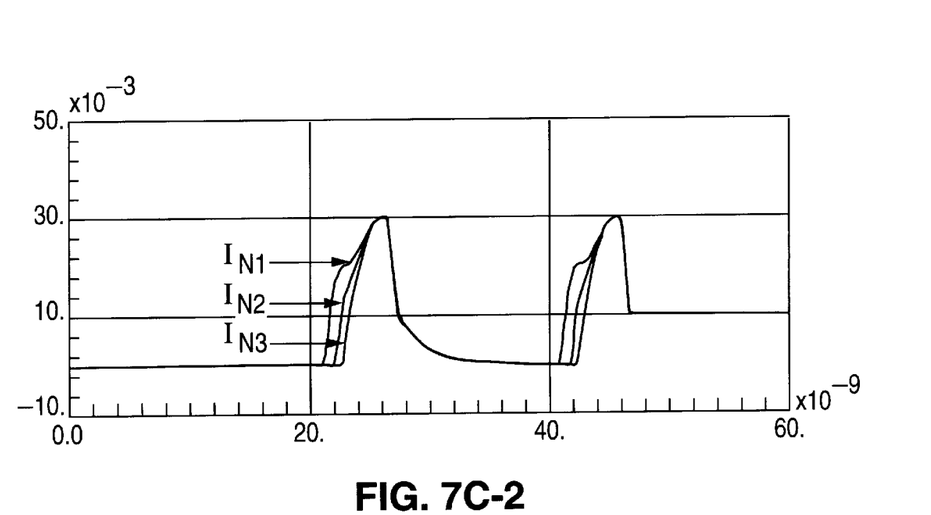

Referring to FIG. 6, the drain currents of transistors P1–P3 are defined to be $I_{P1}$–$I_{P3}$. Similarly, the drain currents of transistors N1–N3 are defined to be $I_{N1}$–$I_{N3}$. These currents are plotted vs time in FIGS. 7C1 and 7C2.

As shown in FIGS. 7C1 and 7C2, $I_{P1}$–$I_{P3}$ are staggered in time, reducing the peak charging current through the output load capacitance. Similarly, $I_{N1}$–$I_{N3}$ are also staggered in time, reducing the peak discharging current through the output load capacitance. This time staggering reduces the peak di/dt in the ground line inductance and the VCC line inductance, reducing the peak ground bounce voltage and the peak VCC bounce voltage. Note, from FIGS. 7C1 and 7C2, that none of the $I_{P1}$–$I_{P3}$ currents overlap any of the $I_{N1}$–$I_{N3}$ currents in time. Thus VCC to ground current spikes are prevented, minimizing the peak ground/VCC bounce voltages.

Note, from FIGS. 7A–7B, that the fall times of the DA1–DA3 waveforms are considerably slower than their rise times. These slow fall times ensure that the p-channel driver transistors P1, P2, and P3 will be turned on slowly, thereby reducing VCC bounce.

Similarly, note from FIGS. 7A–7B, that the rise times of the DB1–DB3 waveforms are considerably slower than their fall times. These slow rise times ensure that the n-channel driver transistors N1, N2, and N3 will be turned on slowly, thereby reducing ground bounce.

Figure 8:
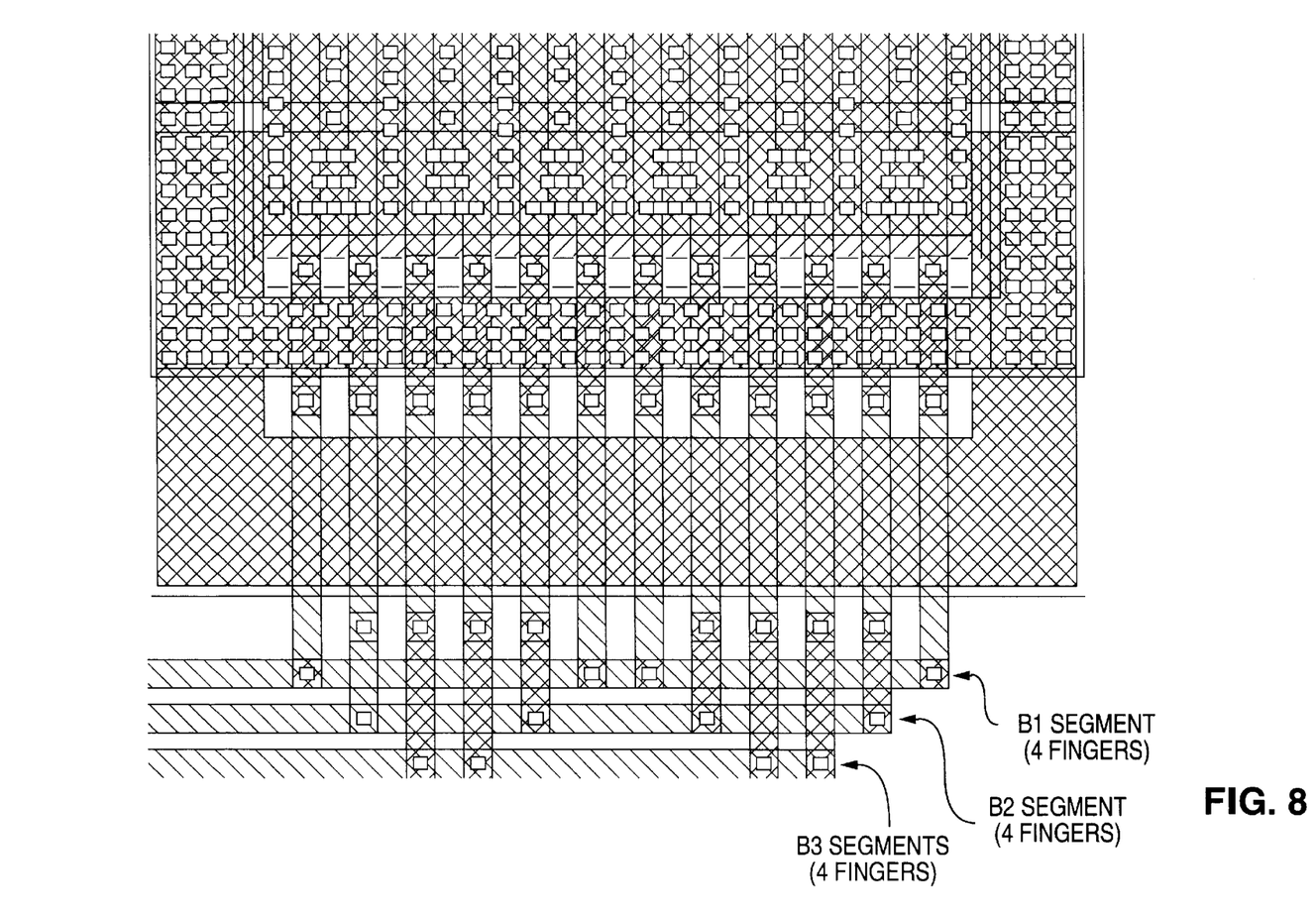
FIG. 8 is a plan view illustrating a layout for the n-channel output transistors where the gates of the transistors N1, N2, and N3 each have four 'fingers' in accordance with the present invention.

Although the present invention utilizes multiple p-channel and n-channel driver transistors P1–Pn and N1–Nn, these transistors can be laid out in a highly compact manner. Thus, the three p-channel driver transistors P1, P2, and P3, and the three n-channel driver transistors N1, N2, and N3 shown in FIG. 6 can be compactly laid out as if they were only two transistors instead of six. An example of this compact layout for the n-channel driver transistors is shown in FIG. 8 where the gates of transistors N1, N2, and N3 each have four 'fingers'.

One of the advantages of the present invention is that output driver 300 employs dual delay line circuits to simultaneously minimize ground bounce and VCC bounce. The asymmetric nature of these dual delay line circuits provides two means of minimizing ground bounce and VCC bounce.

First, the p-channel and n-channel driver transistors P1–Pn and N1–Nn are turned on very slowly, thereby minimizing the peak di/dt in the output inductance and the output capacitance. Second, current spikes are prevented from occurring when the p-channel and n-channel driver transistors change state, despite the fact that these transistors are being turned on very slowly. (In those circuits which allow current spikes to occur, ground and VCC bounce is actually increased, which is the direct opposite of what is required).

Since the dual delay line circuits provide asymmetric rise/fall delays, they allow output driver 300 to have a shorter propagation delay in comparison to circuits which slow down the rising and failing edges of the pre-driver stage(s) by approximately the same amount.

In addition, a precision current reference or voltage reference is not required. Use of such references usually requires slow, expensive (and sometimes unreliable) trimming procedures.

Furthermore, the multi-stage delay line circuits provide a stair-step approximation to an ideal current ramp flowing in the output inductance and the output capacitance. This is not the case for circuits which employ only a single stage of delay in the pre-driver.

The minimum amount of ground bounce which can be achieved by any given bounce control circuit depends upon the following five circuit parameters: 1) L, the ground line inductance; 2) CL, the load capacitance which must be discharged; 3) N, the number of output buffers which must simultaneously switch from a logic one to a logic zero on the same ground line; 4) $\Delta V$, the required output voltage swing (from VCC to the logic zero level); and 5) $\Delta T$, the required discharge time (output buffer propagation delay).

Therefore, ground bounce will increase if L, CL, N, or $\Delta V$ are increased, or if $\Delta T$ is decreased. Conversely, ground bounce will decrease if L, CL, N, or $\Delta V$ are decreased, or if $\Delta T$ is increased. Ground bounce is inversely proportional to $\Delta T$ squared.

Figure 9A:
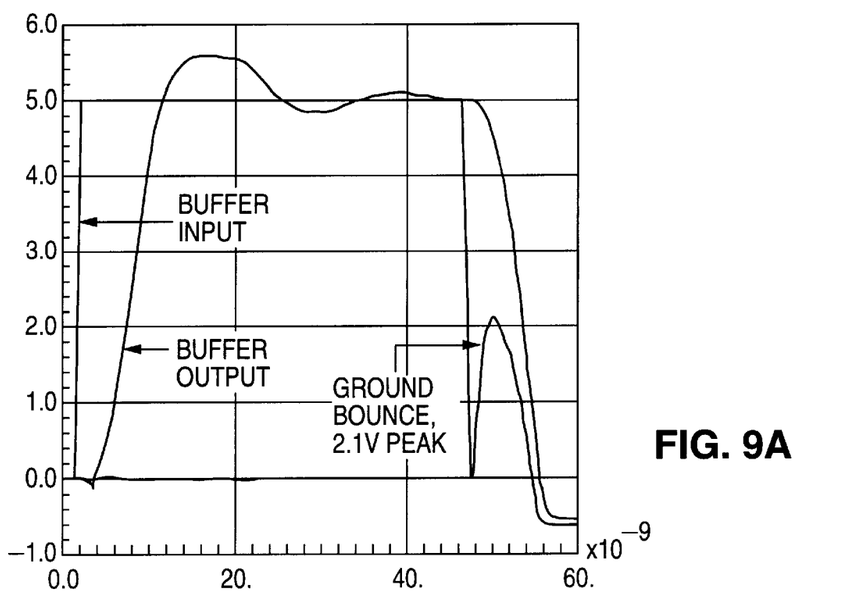
FIGS. 9A and 9B are waveform diagrams illustrating the ground-bounce advantages of the present invention.
Figure 9B:
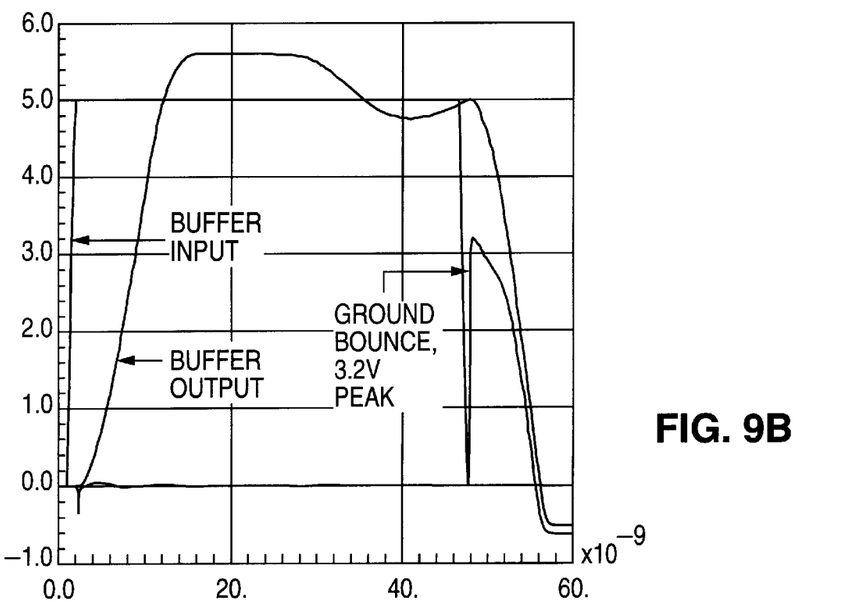

FIGS. 9A and 9B show ground bounce waveforms that illustrate the ground bounce advantages of the present invention for the following five values of the circuit parameters enumerated above: 1) L=10 nh; 2) CL=100 pf; 3) N=8 buffers; 4) ΔV=3.5V (5V–1.5V); and 5) ΔT=7 ns.

As shown in FIGS. 9A and 9B, the ground bounce is 2.1V when output driver 300 of the present invention is used, while the ground bounce is substantially higher (3.2V) when a conventional driver, such as driver 100 of FIG. 1, is used.

The minimum amount of VCC bounce which can be achieved by any given bounce control circuit depends upon the following five circuit parameters: 1) L, the VCC line inductance; 2) CL, the load capacitance which must be charged up; 3) N, the number of output buffers which must simultaneously switch from a logic zero to a logic one on the same VCC line; 4) ΔV, the required output voltage swing (from ground to the logic one level); and 5) ΔT, the required charge time (output buffer propagation delay).

Therefore, VCC bounce will increase if L, CL, N, or ΔV are increased, or if ΔT is decreased. Conversely, VCC bounce will decrease if L, CL, N, or ΔV are decreased, or if ΔT is increased. VCC bounce is inversely proportional to ΔT squared.

Figure 10A:
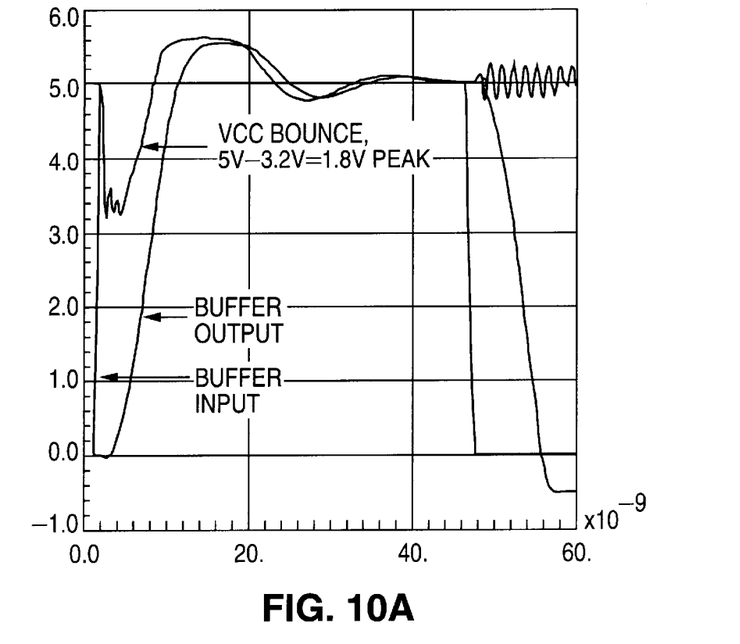
FIGS. 10A and 10B are waveform diagrams illustrating the VCC-bounce advantages of the present invention.
Figure 10B:
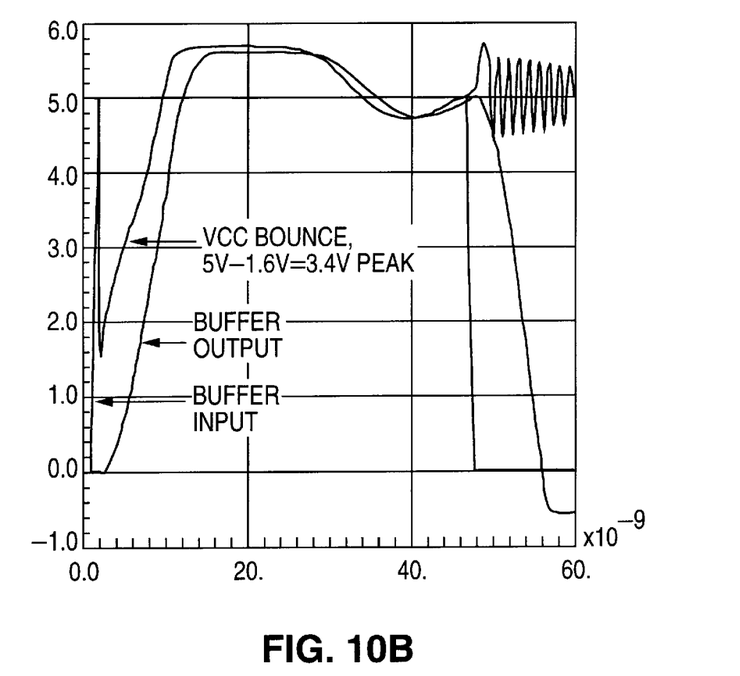

FIGS. 10A and 10B show VCC bounce waveforms that illustrate the VCC bounce advantages of the present invention for the following five values of the circuit parameters enumerated above: 1) L=10 nh; 2) CL=100 pf; 3) N=8 buffers; 4) ΔV=1.5V (1.5V–0V); and 5) ΔT=7 ns.

As shown in FIGS. 10A and 10B, the VCC bounce is 1.8V (5.0V–3.2V=1.8V) when the present invention is used, while the VCC bounce is substantially higher (5V–1.6V=3.4V), when the present invention is not used.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An output driver comprising:
   a first delay circuit having:
      an input connected to receive a first input signal, the first input signal having a logic state, and
      a plurality of first delay stages that output a corresponding plurality of delayed first signals which change logic states at different times after the logic state of the first input signal changes state, a first delay stage of the plurality of first delay stages having:
         a first inverter, the first inverter having a first transistor and a second transistor connected to the first transistor, the first transistor having a width-to-length (W/L) ratio, the second transistor having a W/L ratio, the W/L ratio of the first transistor being greater than the W/L ratio of the second transistor;
         a second inverter connected to the first inverter, the second inverted having a first transistor and a second transistor connected to the first transistor of the second inverter, the first transistor of the second inverter having a W/L ratio, the second transistor of the second inverter having a W/L ratio, the W/L ratio of the first transistor of the second inverter being substantially equal to the W/L ratio of the second transistor of the second inverter;
   a plurality of first driver transistors which are each connected to receive a delayed first input signal;
   a second delay circuit having:
      an input connected to receive a second input signal, the second input signal having a logic state, and
      a plurality of second delay stages that output a corresponding plurality of delayed second signals which change logic states at different times after the logic state of the second input signal changes state; and
   a plurality of second driver transistors which are each connected to the first driver transistors and to receive a delayed second input signal.

2. The driver of claim 1 wherein the first inverter outputs a delayed first signal of the plurality of delayed first signals, the delayed first signal output by the first inverter having a rise time and a fall time, and wherein the rise time is less than the fall time.

3. The driver of claim 1 wherein a first driver transistor of the plurality of first driver transistors is a p-channel MOS transistor, and a second driver transistor of the plurality of second driver transistors is an n-channel MOS transistor.

4. The driver of claim 1 wherein the first delay stages sequentially turn off the first driver transistors; and the second delay stages sequentially turn on the second driver transistors only after the first driver transistors are all turned off.

5. The driver of claim 1 wherein a second delay stage of the plurality of second delay stages of the second delay circuit includes a first inverter having a first transistor and a second transistor connected to the first transistor of the first inverter of the second delay stage, the first transistor of the first inverter of the second delay stage having a W/L ratio, the second transistor of the first inverter of the second delay stage having a W/L ratio, the W/L ratio of the first transistor of the first inverter of the second delay stage being less than the W/L ratio of the second transistor of the first inverter of the second delay stage.

6. The driver of claim 5 wherein the second delay stage further includes a second inverter connected to the first inverter of the second delay stage, the second inverter having a first transistor and a second transistor connected to the first transistor of the second inverter of the second delay stage, the first transistor of the second inverter of the second delay stage having a W/L ratio, the second transistor of the second inverter of the second delay stage having a W/L ratio, the W/L ratio of the first transistor of the second inverter of the second delay stage being substantially equal to the W/L ratio of the second transistor of the second inverter of the second delay stage.

7. The driver of claim 5 wherein the first inverter of the second delay stage outputs a delayed second signal of the plurality of delayed second signals, the delayed second signal output by the first inverter having a rise time and a fall time, and wherein the rise time is greater than the fall time.

8. The driver of claim 1 wherein the first driver transistors and the second driver transistors are connected to an output pad.

9. The driver of claim 1 wherein the input of the first delay circuit and the input of the second delay circuit are connected together.

10. An output driver comprising:
   a first delay circuit having:
      an input connected to receive a first input signal, the first input signal having a logic state, and
      a plurality of first delay stages that output a corresponding plurality of delayed first signals which change logic states at different times after the logic state of the first input signal changes state, a first delay stage of the plurality of first delay stages having a first inverter, the first inverter having a first transistor and a second transistor connected to the first transistor, the first transistor having a width-to-length (W/L) ratio, the second transistor having a W/L ratio, the W/L ratio of the first transistor being greater than the W/L ratio of the second transistor;

a plurality of first driver transistors which are each connected to receive a delayed first input signal;

second delay circuit having:

an input connected to receive a second input signal, the second input signal having a logic state, and a plurality of second delay stages that output a corresponding plurality of delayed second signals which change logic states at different times after the logic state of the second input signal changes state, a second delay stage of the plurality of second delay stages of the second delay circuit includes a first inverter having a first transistor and a second transistor connected to the first transistor of the first inverter of the second delay stage, the first transistor of the first inverter of the second delay stage having a W/L ratio, the second transistor of the first inverter of the second delay stage having a W/L ratio, the W/L ratio of the first transistor of the first inverter of the second delay stage being less than the W/L ratio of the second transistor of the first inverter of the second delay stage; and a plurality of second driver transistors which are each connected to the first driver transistors and to receive a delayed second input signal.

11. The driver of claim 10 wherein the second delay stage further includes a second inverter connected to the first inverter of the second delay stage, the second inverter having a first transistor and a second transistor connected to the first transistor of the second inverter of the second delay stage, the first transistor of the second inverter of the second delay stage having a W/L ratio, the second transistor of the second inverter of the second delay stage having a W/L ratio, the W/L ratio of the first transistor of the second inverter of the second delay stage being substantially equal to the W/L ratio of the second transistor of the second inverter of the second delay stage.

12. The driver of claim 10 wherein the first inverter of the second delay stage outputs a delayed second signal of the plurality of delayed second signals, the delayed second signal output by the first inverter having a rise time and a fall time, and wherein the rise time is greater than the fall time.

13. The driver of claim 10 wherein the first driver transistors and the second driver transistors are connected to an output pad.

14. The driver of claim 10 wherein the input of the first delay circuit and the input of the second delay circuit are connected together.

15. The driver of claim 7 wherein the first delay stages sequentially turn off the first driver transistors; and the second delay stages sequentially turn on the second driver transistors only after the first driver transistors are all turned off.

* * * * *

UNITED STATES PATENT AND TRADEMARK OFFICE
CERTIFICATE OF CORRECTION

PATENT NO. : 6,184,729
DATED : February 6, 2001
INVENTOR(S) : Ronald Pasqualini

It is certified that error appears in the above-identified patent and that said Letters Patent is hereby corrected as shown below:

In col. 9, line 8, before "second" insert --a--.

In col. 10, line 25, delete "7" and replace with --10--.

Signed and Sealed this

Fifth Day of June, 2001

Attest:

Attesting Officer

NICHOLAS P. GODICI
*Acting Director of the United States Patent and Trademark Office*